United States Patent
Yan

(10) Patent No.: US 8,610,496 B2
(45) Date of Patent: Dec. 17, 2013

(54) SWITCHED AMPLIFIER CIRCUIT ARRANGEMENT AND METHOD FOR SWITCHED AMPLIFICATION

(75) Inventor: Weixun Yan, Greifensee (CH)

(73) Assignee: AMS AG, Unterpremstaetten (AT)

( * ) Notice: Subject to any disclaimer, the term of this patent is extended or adjusted under 35 U.S.C. 154(b) by 36 days.

(21) Appl. No.: 13/393,161

(22) PCT Filed: Aug. 18, 2010

(86) PCT No.: PCT/EP2010/062055
§ 371 (c)(1),
(2), (4) Date: May 22, 2012

(87) PCT Pub. No.: WO2011/023614
PCT Pub. Date: Mar. 3, 2011

(65) Prior Publication Data
US 2012/0242407 A1    Sep. 27, 2012

(30) Foreign Application Priority Data
Aug. 28, 2009    (EP) .................................... 09011069

(51) Int. Cl.
*H03F 1/02* (2006.01)
(52) U.S. Cl.
USPC ................................. 330/9; 330/51; 327/124
(58) Field of Classification Search
USPC .................... 330/9, 51, 85, 86, 110; 327/124
See application file for complete search history.

(56) References Cited

U.S. PATENT DOCUMENTS

| | | | |
|---|---|---|---|
| 3,801,919 A | 4/1974 | Wilkes et al. | |
| 5,717,361 A | 2/1998 | Saito | |
| 7,944,288 B2 * | 5/2011 | Ummelmann | ..................... 330/9 |
| 2003/0006920 A1 | 1/2003 | Mori | |

FOREIGN PATENT DOCUMENTS

| | | |
|---|---|---|
| EP | 0 812 061 | 12/1997 |
| WO | WO 2007/102863 | 9/2007 |

OTHER PUBLICATIONS

Y. Chae et al., "A 0.7V 36uW 85dB-DR audio ΔΣ modulator using class-C inverter", IEEE International Solid-State Circuits Conference 2008, pp. 490-491, p. 630.

M. Keskin et al., "A 1-V 10-MHz clock-rate 13-bit CMOS ΔΣ modulator using unity-gain-reset op amps" IEEE J. Solid-State Circuits, vol. 37, pp. 817-824, Jul. 2002

F. Krummenacher et al., "Class AB CMOS amplifier for micropower SC filters", Electronics Letters, vol. 17, No. 13, pp. 433-435, Jun. 25, 1981.

* cited by examiner

*Primary Examiner* — Robert Pascal
*Assistant Examiner* — Khiem Nguyen
(74) *Attorney, Agent, or Firm* — McDermott Will & Emery LLP

(57) ABSTRACT

A switched amplifier circuit arrangement comprises a main amplifier (Amp) having an input terminal (In) and an output terminal (Out) and a regulating amplifier (rAmp) to set an input and an output operating point of the main amplifier (Amp). The regulating amplifier (rAmp) exhibits an auxiliary amplifier (A) having a first input terminal coupled to a reference level (Vref), a second input terminal (Ain) coupled to the output terminal (Out), and an output terminal (Aout) which is connected via a first switch (S1) to the input terminal (In). Moreover, the switched amplifier circuit arrangement comprises a cancellation capacitor (Cc) coupled to the input terminal (In), a second switch (S2) which is coupled between the output terminal (Out) and the cancellation capacitor (Cc) at a first circuit node (n1), and a third switch (S3) connected between the circuit node (n1) and the reference level (Vref).

16 Claims, 5 Drawing Sheets

SWITCHED AMPLIFIER CIRCUIT ARRANGEMENT AND METHOD FOR SWITCHED AMPLIFICATION

RELATED APPLICATIONS

This is a U.S. national stage of application no. PCT/EP2010/062055, filed on Aug. 18, 2010. This application claims the priority of European patent application no. 09 011 069.3 filed Aug. 28, 2009, the entire content of which is hereby incorporated by reference.

FIELD OF THE INVENTION

The present invention relates to a switched amplifier circuit arrangement, an integrator, a chip assembly and a method for switched amplification.

BACKGROUND OF THE INVENTION

Switched amplifiers have diverse applications in broad fields of signal processing, such as audio applications. They can be implemented in integrators and modulators, as the central pieces for discrete-time signal processing, such as switched capacitor filters and data converters. The performance of the switched amplifiers relies on accurate setting of the input and output operating points of the amplifier.

SUMMARY OF THE INVENTION

It is an object of the present invention to provide a switched amplifier circuit arrangement as well as a method for switched amplification in which the input and output operating point can be set and regulated independently.

According to an aspect of the invention, the switched amplifier circuit arrangement comprises a main amplifier having an input terminal and an output terminal, and a regulating amplifier to set input and output operating point of the main amplifier. That regulating amplifier exhibits an auxiliary amplifier having a first input terminal coupled to a reference level, a second input terminal coupled to the output terminal of the main amplifier, and an output terminal which is connected by a first switch to the input terminal of the main amplifier. The regulating amplifier further comprises a cancellation capacitor which is coupled to the input terminal and a second switch which is coupled between the output terminal and the cancellation capacitor at a first circuit node, as well as a third switch connected between the first circuit node and the reference level.

The switched amplifier circuit arrangement operates in two phases. During a reset phase, the first switch and the second switch are closed. At the same time, the third switch remains open. A feedback loop formed via the first switch and the auxiliary amplifier spontaneously regulates the input DC operating point and sets the output DC operating point of the main amplifier to the reference level. Preferably, the reference level should be equal to the common ground of the system. In one embodiment, the cancellation capacitor essentially is a DC isolation capacitor and is charged to hold an offset voltage and, at the same time, serves as a Miller compensation capacitor to stabilize the feedback loop.

In an amplification phase only the third switch is closed, and the first and second switches remain open. The main amplifier is in normal amplification mode, based on the operating points obtained during the reset phase. In particular, the output DC operating point is held at the reference level. The voltage difference between the input operating point of the main amplifier and the virtual ground is maintained by the cancellation capacitor, i.e. the DC level isolation capacitor, in this phase.

Advantageously, the operating points, i.e. the input and output DC operating points are separately set and regulated using the feedback loop. The feedback loop spontaneously optimizes and regulates the input operating point to its optimal value. Furthermore, the feedback loop enables robust and accurate setting of input and output operating points. For optimal performance, the reference level should be at the virtual ground potential of the system. Additionally, the cancellation capacitor not only stabilizes the feedback loop but constitutes a Miller-compensation capacitor. As such, it reduces the required current for the main amplifier to guarantee the stability of the feedback loop, and both the main amplifier and auxiliary amplifier can have very low current consumption. In turn, this reduces bandwidth requirements on the auxiliary amplifier.

According to another aspect, the main amplifier in the switched amplifier circuit arrangement comprises an inverting amplifier.

During the amplification phase the inverting amplifier is operated in a push/pull configuration.

Advantageously, using the inverting amplifier allows for low supply voltage operation and power consumption, as compared to e.g. commonly used operational amplifiers. At the same time, inverting amplifiers allow for easier integration in further down-scaled CMOS processes.

According to another aspect, the switched amplifier circuit arrangement comprises a bias voltage terminal which is coupled via a bias switch to a second circuit node and a bias capacitor which is coupled between the second circuit node and the first switch.

In the reset phase the bias switch is closed and a voltage is charged onto the bias capacitor via the bias switch. During amplification phase, the bias capacitor provides a floating voltage source between the control terminals of the two transistors and, thus, defines the output characteristics of the main amplifier.

Charging a bias voltage onto the bias capacitor allows for setting the amplification mode of the main amplifier. Preferably, the bias voltage is chosen to allow for class AB amplification of the main amplifier during the amplification phase. These features result in a high slew rate, fast settling and large output swing together with low voltage operation and low current consumption.

According to another aspect, the switched amplifier circuit arrangement comprises an inverting amplifier having a first and a second transistor. The first transistor comprises a control terminal connected to the second circuit node and, on its load side, is coupled between a supply voltage and a third circuit node. The third circuit node is coupled between the output terminal and the second input terminal of the auxiliary amplifier. Furthermore, the second transistor comprises a control terminal connected to the input terminal and, on its load side, is coupled to another supply voltage and the third circuit node.

Advantageously, using transistors helps integration on integrated circuits as well as providing low current consumption. In turn, this further reduces bandwidth requirements on the auxiliary amplifier and thus allows for low current operation of the inverting amplifier.

According to another aspect, the switched amplifier circuit arrangement comprises an inverting amplifier contacted as a cascode inverting amplifier. The inverting amplifier further comprises a third and a fourth transistor. The third transistor exhibits a control terminal connected to a first bias voltage and, on its load side, is coupled between the first transistor and the third circuit node. Furthermore, the fourth transistor comprises a control terminal connected to a second bias voltage and, on its load side, is coupled between a second transistor and the third circuit node. In conclusion, the third and the fourth transistor form a respective cascode stage with respect to the first and second transistor.

The cascode inverting amplifier is similar to the inverting amplifier circuit in that it also provides easy integration on integrated circuits and low current consumption. However, the cascode inverting amplifier allows for high gain applications.

According to another aspect, the inverting amplifier comprises bipolar transistors.

According to another aspect, the inverting amplifier comprises unipolar transistors.

According to another aspect, the auxiliary amplifier comprises a differential amplifier.

According to another aspect, the main amplifier comprises an operational amplifier.

According to another aspect, the switches each comprise at least one transistor.

According to an aspect of the invention, an integrator comprises a switched amplifier circuit arrangement, as described above, and an integrating circuit. The integrating circuit exhibits a series connection comprising a fourth switch connected to the voltage input terminal, a sampling capacitor, a seventh switch and an integration capacitor which is connected to the second input terminal. Furthermore, the integrating circuit exhibits a fourth circuit node coupled between the fourth switch and the sampling capacitor, a fifth circuit node coupled between the sampling capacitor on one side, and the third switch and the seventh switch on the other side, as well as a sixth switch coupled to the fifth node and common ground.

In the reset phase, the bias, first, second and fourth switch are closed. All other switches remain open. Preferably, the bias voltage is chosen such to provide class AB amplification of the main amplifier. During the reset phase, the inverting amplifier is switched with the feedback loop and the auxiliary amplifier, and an offset voltage is sampled into the cancellation capacitor. At the same time, a voltage at the input is sampled into the sampling capacitor with respect to the common ground. At this phase, both transistors in the inverting amplifier are biased with a static current, which can be quite low or even zero. At the beginning of the amplification phase, either the first or the second transistor in the inverting amplifier is turned on depending on the polarity of the voltage at the input, while the other is completely off. Due to the negative feedback formed through the integration capacitor the voltage on the input of the inverting amplifier is being forced to return to its optimal operating point. The charge in the sampling capacitor is then transferred into the integration capacitor in a similar fashion as in conventional SC circuits. Once the charge transfer is completed, the input of the inverting amplifier returns to its optimal operating point, and the transistors in the inverting amplifier are biased with the static current. Therefore, a high slew rate is obtained with minimum static current.

Advantageously, the integration of a switched amplifier circuit arrangement into an integrator features low current consumption, high slew rate, fast settling and large output swing. Furthermore, the compensation capacitor accounts for the generally unpredictable offset voltage and acts as a Miller compensation capacitor. This reduces the bandwidth requirement on the auxiliary amplifier which, in turn, allows for low current consumption of the main amplifier.

According to another aspect, the integrator comprises a first switched amplifier circuit arrangement and a second switched amplifier circuit arrangement connected in a pseudo-differential fashion. The first switched amplifier circuit arrangement comprises a first output switch coupled between an output terminal of the first switched amplifier circuit arrangement and a first voltage output terminal. The second switched amplifier circuit arrangement comprises a second output switch coupled between an output terminal of the second switched amplifier circuit arrangement and a second voltage output terminal. Furthermore, the integrator exhibits a voltage input terminal of the first switched amplifier circuit arrangement which is connected to the fifth switch of the second switched amplifier circuit arrangement, and, similarly, a voltage input terminal of the second switched amplifier circuit arrangement which is connected to the fifth switch of the first switched amplifier circuit arrangement. Additionally, the integrator also comprises a first common-mode feedback circuit connected to the fifth node of the first switched amplifier circuit arrangement as well as a second common-mode feedback connected to the fifth node of the second switched amplifier circuit arrangement.

The integrator constitutes a pseudo-differential integrator and is implemented for improved noise immunity and reduced non-linearity. Advantageously, the common-mode feedback circuits reduce the influence of voltage fluctuations common to both input signals on output signals.

According to another aspect, the first and second common-mode feedback circuits each comprise a first common-mode capacitor coupled to a sixth circuit node and to the second voltage output terminal and common ground via a first common-mode switch and a second common-mode switch. Moreover, the second common-mode capacitor is coupled to the sixth circuit node and to the first voltage output terminal and common ground via a third common-mode switch and a fourth common-mode switch. The sixth circuit node of the first common-mode feedback circuit is connected to the first switched amplifier circuit arrangement via a fifth circuit node, and the sixth circuit node of the second common-mode feedback circuit is connected to the second switched amplifier circuit arrangement via its fifth circuit node.

During the reset phase, the common-mode capacitors are discharged to common ground. In the amplification phase, the common-mode capacitors detect the difference between virtual and common ground, and feed this difference into the first and second switched amplifier circuit arrangement, such that a common-mode feedback loop is established, and the common-mode fluctuation is removed.

According to an aspect of the invention, a chip assembly comprises a switched amplifier circuit arrangement according to the description above and/or an integrator implemented on a chip and all bias and cancellation capacitors and/or integration, sampling and common-mode capacitors are externally connected to the chip.

Capacitors connected externally to the chip allow for easy integration of the switched amplifier circuit arrangement and/or integrator into an integrated circuit structure. In an alternative embodiment the capacitors are integrated into an integrated circuit structure as required capacitance is rather low.

According to an aspect of the invention, a method for switched amplification exhibits a reset and amplification phase. The reset phase comprises several operations starting by charging a bias voltage onto a charge storage and providing a reference level. Next operations involve setting an input operating point, setting an output operating point as a function of the reference level, comparing the output operating point to the reference level and regulating the input operating point. Finally, the operations of setting the input and output operating point, comparing and regulating are repeated in every reset phase.

The amplification phase comprises amplifying a signal depending on the input operating point and the output operating point and the bias voltage from the charge storage.

Advantageously, input and output operating points are independently set and regulated and thus can be optimized with respect to a given application and its characteristic parameters.

BRIEF DESCRIPTION OF THE DRAWINGS

Like reference numerals designate corresponding similar parts or elements.

DETAILED DESCRIPTION OF THE DRAWINGS

Figure 1:
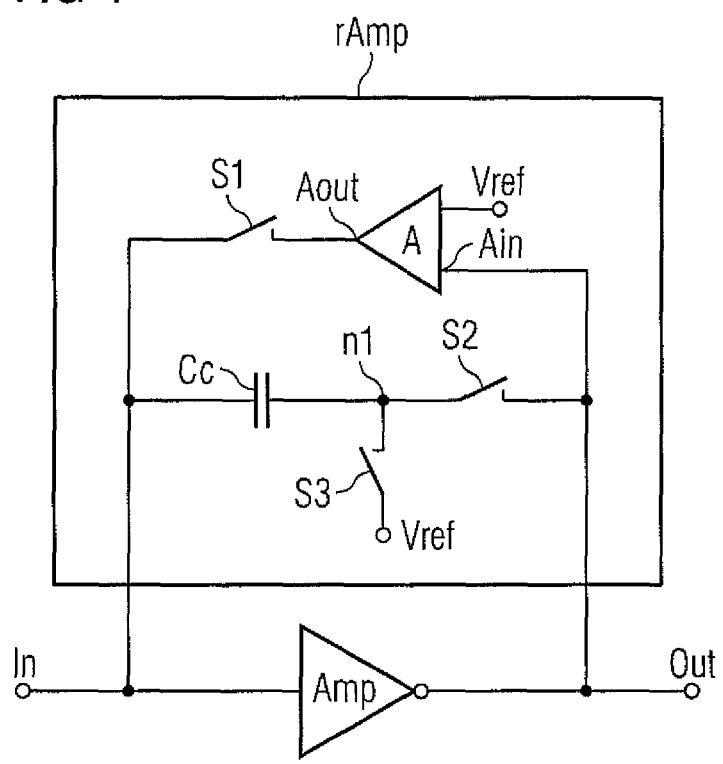
FIG. 1 shows an exemplary embodiment of a switched amplifier circuit arrangement according to the invention.

FIG. 1 shows an exemplary embodiment of a switched amplifier circuit arrangement according to the invention.

The switched amplifier circuit arrangement comprises two basic elements. First, a main amplifier Amp having an input terminal In and an output terminal Out. Second, a regulating amplifier rAmp to set an input and an output operating point of the main amplifier Amp. The regulating amplifier rAmp comprises an auxiliary amplifier A having a first input terminal coupled to a reference level Vref, a second input terminal Ain coupled to the output terminal Out, and an output terminal Aout which is connected by a first switch S1 to the input terminal In. Furthermore, the regulating amplifier rAmp has a cancellation capacitor Cc coupled to the input terminal In, a second switch S2 which is coupled between the output terminal Out and the cancellation capacitor Cc at a first circuit node n1, and a third switch S3 connected between the circuit node n1 and the reference level Vref.

The switched amplifier circuit arrangement is operated in two phases. In a reset phase the first switch S1 and the second switch S2 are closed. The third switch S3 remains open. A feedback loop formed by the first switch S1 and the auxiliary amplifier A connects the input terminal In with the output terminal Out. During the reset phase the feedback loop spontaneously regulates the input DC operating point and sets the output DC operating point to the reference level Vref. At the same time, the cancellation capacitor Cc is charged with an offset voltage. In an amplification phase, the first switch S1 and the second switch S2 are open and the third switch S3 is closed. The main amplifier Amp is in normal amplification mode. However, the cancellation capacitor Cc is now connected between the input In and the reference level Vref and presents the voltage differences between the input and output DC operating points obtained from the reset phase. The output DC operating point is still held at the reference level Vref.

Advantageously, the operating points for the input DC and output DC are separated using the feedback loop. Thus, the two operating points can be set and optimized independently from each other and, due to the special arrangement of the circuit, are robust and accurate. The cancellation capacitor Cc is a Miller compensation capacitor in the reset phase and reduces bandwidth requirements of the auxiliary amplifier A. In turn, the auxiliary amplifier A features only low current consumption and, consequently, this is also true for the main amplifier Amp. Preferred operation in class AB amplification mode allows high slew rate, fast settling and large output swing.

Figure 2:
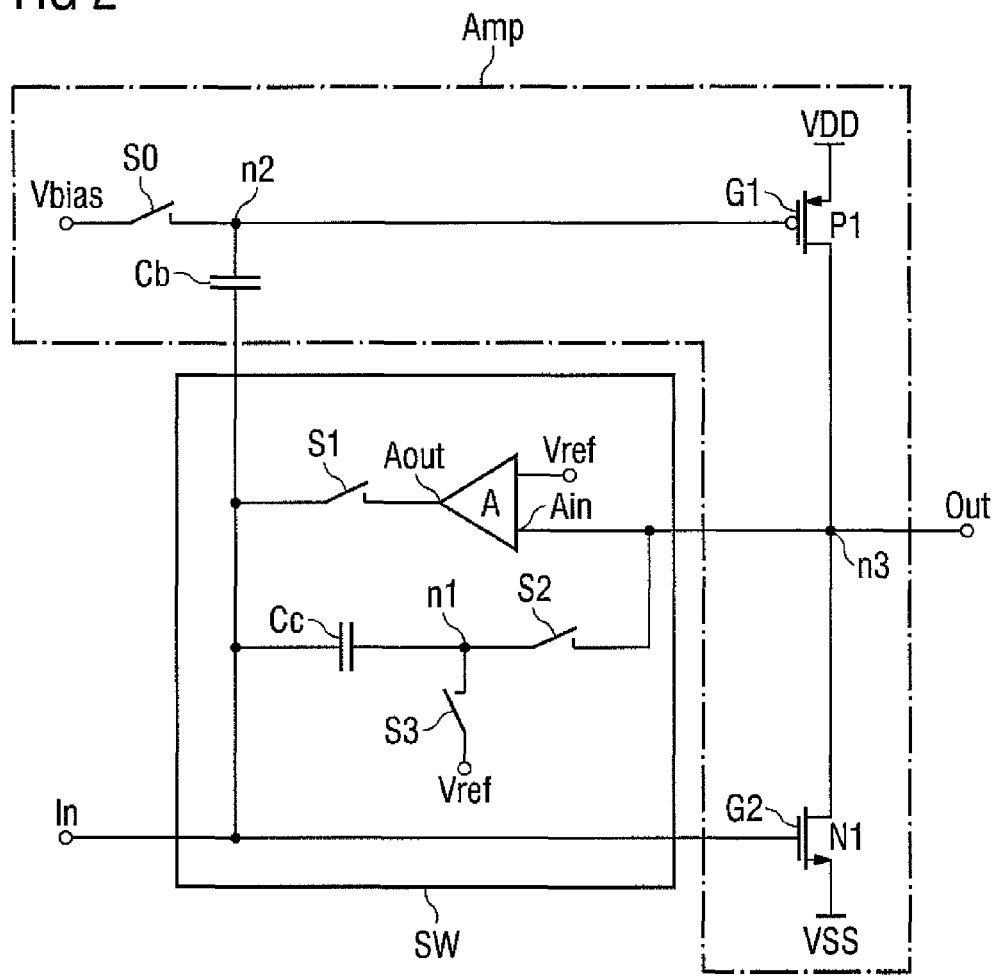
FIG. 2 shows an exemplary embodiment of a switched amplifier circuit arrangement having an inverting amplifier according to the invention.

FIG. 2 shows an exemplary embodiment of the switched amplifier circuit arrangement having an inverting amplifier. A bias voltage terminal Vbias is coupled to a second circuit node n2, and a bias capacitor Cb is coupled between the second circuit node and the first switch S1. A bias switch S0 is coupled between the voltage terminal Vbias and the second circuit node n2. The main amplifier Amp on the switched amplifier circuit arrangement exhibits an inverting amplifier. The inverting amplifier comprises a first transistor P1 having a control terminal G1 connected to the second circuit node n2, and which, on its load side, is coupled between a most positive supply voltage of the system Vdd and a third circuit node n3, with the third circuit node n3 being coupled between the output terminal Out and the second input terminal Ain of the auxiliary amplifier A. Furthermore, the inverting amplifier comprises a second transistor N1 having a control terminal G2 connected to the input terminal In and which, on its load side, is coupled to a most negative supply voltage of the system Vss and the third circuit node n3.

During the reset phase the bias switch S0 is closed and bias capacitor Cb is charged by a bias voltage. During the amplification phase, preferably the bias voltage on the bias capacitor Cb provides class AB biasing to the inverting amplifier. The inverting amplifier functions based on the operating points in a push/pull manner.

Advantageously, the use of an inverting amplifier as an amplifier structure reduces bandwidth and current consumption. Furthermore, the use of transistors further reduces current consumption and allows for easy integration on integrated circuits.

Figure 3:
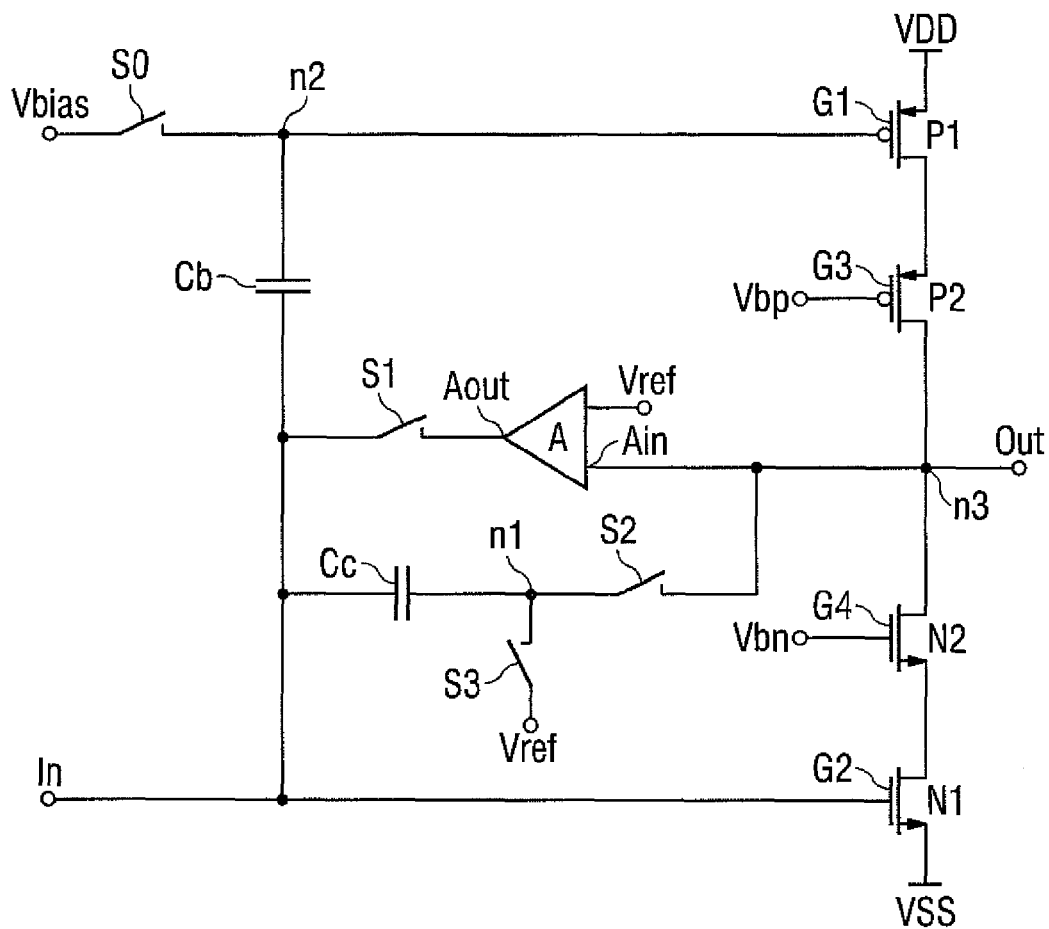
FIG. 3 shows an exemplary embodiment of a switched amplifier circuit arrangement having a cascade inverting amplifier according to the invention.

FIG. 3 shows an exemplary embodiment of a switched amplifier circuit arrangement having a cascode inverting amplifier according to the invention. In addition, compared to the inverting amplifier of FIG. 2, the cascode inverting amplifier further comprises a third transistor P2 having a control terminal G3 connected to a first bias voltage Vbp and which, on its load side, is coupled between the first transistor P1 and the third circuit node n3. Furthermore, the cascode inverting amplifier comprises a fourth transistor N2 having a control terminal G4 connected to a second bias voltage Vbn and which, on its load side, is coupled between the second transistor N1 and the third circuit node n3.

While operation of the cascode inverting amplifier is similar to the inverting amplifier according to FIG. 2, cascode circuitry has the advantage of higher amplification gain.

Figure 4:
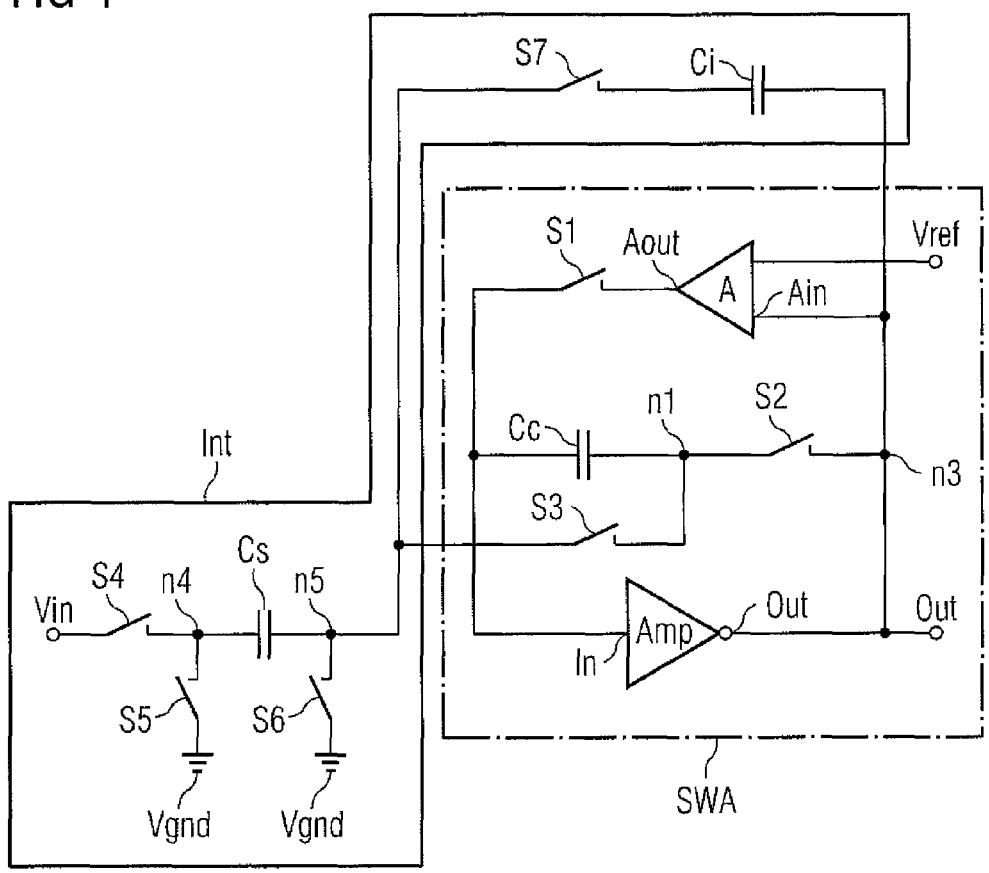
FIG. 4 shows an exemplary embodiment of an integrator based on the switched amplifier circuit arrangement according to the invention.

FIG. 4 shows an exemplary embodiment of an integrator according to the invention. The integrator comprises two basic elements. First, a switched amplifier circuit arrangement SWA according to the invention. Second, an integrating circuit Int having a series connection comprising a fourth switch S4 connected to a voltage input terminal Vin, a sampling capacitor Cs, a seventh switch S7 and an integration capacitor Ci which is connected to the second input terminal Ain. Moreover, the integrating circuit Int exhibits a fourth circuit node n4 coupled between the fourth switch S4 and the sampling capacitor Cs, a fifth circuit node n5 coupled between the sampling capacitor Cs on one side, and the third switch S3 and the seventh switch S7, on the other side. A sixth switch S6 of the integrating circuit Int is coupled to the fifth circuit node n5 and common ground.

In the reset phase, the fourth switch S4 and the sixth switch S6 are closed. Consequently, the input voltage Vin is sampled onto the sampling capacitor Cs with respect to common ground. At the same time, an offset voltage is sampled into the cancellation capacitor Cc of the regulating amplifier rAmp. In the reset phase, both transistors in the inverting amplifier are biased with a static current, which can be quite low or even zero. At the beginning of the amplification phase, only one of the transistors in the inverting amplifier is turned on depending on the polarity of the input, while the other is completely off. The charge in the sampling capacitor Cs is transferred into the integration capacitor Ci in a similar way to conventional SC circuits. Once the charge transfer is completed, the transistors in the inverting amplifier are biased with the static current again. Then, the input voltage of the inverting amplifier returns to its optimal operating point, due to the negative feedback formed through the integration capacitor Ci. Therefore, high slew rate is obtained with minimum static current because only one transistor is necessary to be completely turned on during the transition.

Figure 5:
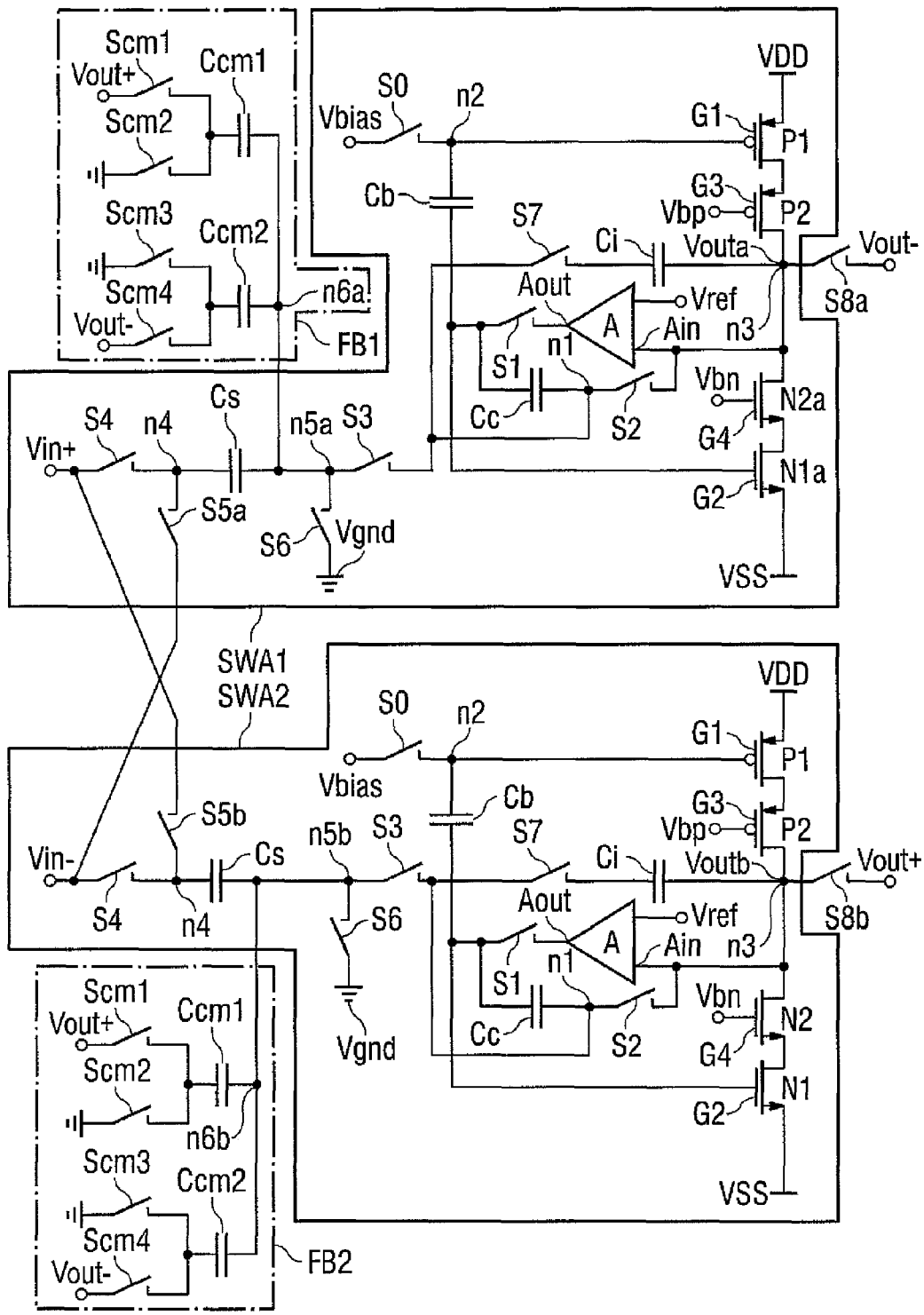
FIG. 5 shows an exemplary embodiment of an integrator in a pseudo-differential arrangement according to the invention.

FIG. 5 shows an exemplary embodiment of an integrator in a pseudo-differential arrangement according to the invention. The integrator Int comprises a first switched amplifier circuit arrangement SWA1 having a first output switch S8a coupled between the output terminal Vouta of the first switched amplifier circuit arrangement SWA1 and a voltage output terminal Vout−. It further comprises a second switched amplifier circuit arrangement SWA2 having a second output switch S8b coupled between an output terminal Voutb, the second switched amplifier circuit arrangement SWA2 and a second voltage output terminal Vout+. Furthermore, a voltage input terminal Vin+ of the first switched amplifier circuit arrangement SWA1 is connected to the fifth switch S5b of the second switched amplifier circuit arrangement SWA2. Similarly, a voltage input terminal Vin− of the second switched amplifier circuit arrangement SWA2 is connected to the fifth switch S5a of the first switched amplifier circuit arrangement SWA1. A first common-mode feedback circuit FB1 is connected to the fifth mode n5a of the first switched amplifier circuit arrangement SWA1. A second common-mode feedback circuit FB2 is connected to the fifth circuit node n5b of the second switched amplifier circuit arrangement SWA2. Furthermore, the first and second common-mode feedback circuits FB1, FB2 each comprise a first common-mode capacitor Ccm1 coupled to a sixth circuit node n6a and to the second voltage output terminal Vout+ and common ground via a first common-mode switch Scm1 and a second common-mode switch Scm2. A second common-mode capacitor Ccm2 is coupled to the sixth circuit node n6a and to the first voltage output terminal Vout− and common ground via a third switch Scm3 and a fourth switch Scm4. The sixth circuit node n6a of the first common-mode feedback circuit FB1 is connected to the first switched amplifier circuit arrangement SWA1 via its fifth circuit node n5a. The sixth circuit node n6b of the second common-mode feedback circuit FB2 is connected to the second switched amplifier circuit arrangement SWA2 via its fifth circuit node n5b.

The common-mode feedback capacitors Ccm1 and Ccm2 in each of the two common-mode feedback circuits FB1 and FB2 detect the difference between the virtual and common ground level during the reset phase, and then charge/discharge this difference during the amplification phase, such that a common-mode feedback loop is realized.

The circuit arrangement presented in FIG. 5 constitutes a pseudo differential integrator and is implemented for improved noise immunity and reduced non-linearities.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A switched amplifier circuit arrangement, comprising:
   a main amplifier having an input terminal and an output terminal; and
   a regulating amplifier comprising:
     an auxiliary amplifier having a first input terminal coupled to a reference level, a second input terminal coupled to the output terminal, and an output terminal which is connected via a first switch to the input terminal,
     a cancellation capacitor coupled to the input terminal,
     a second switch which is coupled between the output terminal of the main amplifier and the cancellation capacitor at first circuit node, and
     a third switch connected between the circuit node and the reference level,
   wherein during a reset phase, the first and the second switch are electrically closed, while the third switch is electrically open, and
   during an amplification phase, the first and the second switch are electrically open, while the third switch is electrically closed.

2. The switched amplifier circuit arrangement according to claim 1, wherein the main amplifier is an inverting amplifier.

3. The switched amplifier circuit arrangement according to claim 1, wherein:
   a bias voltage terminal is coupled to a second circuit node via a bias switch, and
   a bias capacitor is coupled between the second circuit node and the first switch.

4. The switched amplifier circuit arrangement according to claim 3, wherein the inverting amplifier comprises:
   a first transistor having a control terminal connected to the second circuit node, and which on its load side is coupled between a most positive supply voltage of the system and a third circuit node, the third circuit node being coupled between the output terminal and the second input terminal of the auxiliary amplifier, and
   a second transistor having a control terminal connected to the input terminal, and which on its load side is coupled to a most negative supply voltage of the system and the third circuit node.

5. The switched amplifier circuit arrangement according to claim 4, wherein the inverting amplifier comprises a cascode inverting amplifier, comprising:
   a third transistor having a control terminal connected to a first bias voltage (Vbp) and which on its load side is coupled between the first transistor and the third circuit node, and
   a fourth transistor having a control terminal connected to a second bias voltage (Vbn) and which on its load side is coupled between the second transistor and the third circuit node.

6. The switched amplifier circuit arrangement according to claim 4, wherein the inverting amplifier comprises bipolar transistors.

7. The switched amplifier circuit arrangement according to claim 4, wherein the inverting amplifier comprises unipolar transistors.

8. The switched amplifier circuit arrangement according to claim 1, wherein the auxiliary amplifier comprises a differential amplifier.

9. The switched amplifier circuit arrangement according to claim 1, wherein the main amplifier comprises an operational amplifier.

10. The switched amplifier circuit arrangement according to claim 1, wherein the switches each comprise at least one transistor.

11. An integrator, comprising:
the switched amplifier circuit arrangement according to claim 1, and
an integrating circuit comprising:
a series connection comprising a fourth switch connected to a voltage input terminal, a sampling capacitor, a seventh switch and an integration capacitor which is connected to the second input terminal,
a fourth circuit node coupled between the fourth switch and the sampling capacitor,
a fifth switch coupled to the fourth circuit node and common ground, and
a fifth circuit node coupled between the sampling capacitor and a sixth switch coupled to virtual ground on one side and the third switch and the seventh switch on the other side.

12. The integrator according to claim 11, comprising:
the switched amplifier circuit arrangement provided as a first switched amplifier circuit arrangement having a first output switch coupled between an output terminal of the first switched amplifier circuit arrangement and a first voltage output terminal,
a second switched amplifier circuit arrangement having a second output switch coupled between an output terminal of the second switched amplifier circuit arrangement and a second voltage output terminal,
the voltage input terminal of the first switched amplifier circuit arrangement which is connected to the fifth switch of the second switched amplifier circuit arrangement,
the voltage input terminal of the second switched amplifier circuit arrangement which is connected to the fifth switch of the first switched amplifier circuit arrangement,
a first common-mode feedback circuit connected to the fifth node of the first switched amplifier circuit arrangement, and
a second common-mode feedback circuit connected to the fifth node of the second switched amplifier circuit arrangement.

13. The integrator according to claim 12 including the first and second common-mode feedback circuit each comprising:
a first common-mode capacitor coupled to a sixth circuit node and to the second voltage output terminal and common ground via a first common-mode switch and a second common-mode switch, and
a second common-mode capacitor coupled to the sixth circuit node and to the first voltage output terminal and common ground via a third switch and a fourth switch, and
wherein the sixth circuit node of the first common-mode feedback circuit is connected to the first switched amplifier circuit arrangement via its fifth circuit node, and
wherein the sixth circuit node of the second common-mode feedback circuit is connected to the second switched amplifier circuit arrangement via its fifth circuit node.

14. A chip assembly comprising:
the switched amplifier circuit arrangement according to claim 1 implemented on a chip, and
all bias and cancellation capacitors and/or integration, sampling and common-mode capacitors externally connected to the chip or integrated on-chip.

15. A chip assembly comprising:
an integrator according to claim 11 implemented on a chip, and
all bias and cancellation capacitors and/or integration, sampling and common-mode capacitors, externally connected to the chip or integrated on-chip.

16. A method for switched amplification, comprising consecutively switching between a reset phase and an amplification phase in which
wherein the reset phase comprises:
charging a charge storage using a bias voltage,
providing a reference level,
regulating an input operating point,
setting an output operating point to the reference level,
comparing the output operating point to the reference level,
regulating the input operating point depending on that comparison, and
repeating regulating the input operating point, setting the output operating point, comparing and regulating, and
wherein the amplification phase comprises amplifying a signal depending on the input operating point, the output operating point and the bias voltage from the charge storage.

* * * * *